(12) United States Patent
Brown

(10) Patent No.: US 12,348,016 B2
(45) Date of Patent: Jul. 1, 2025

(54) CONFIGURABLE BOX BRIDGE FRAME

(71) Applicant: TE Connectivity Solutions GmbH, Schaffhausen (CH)

(72) Inventor: Michael Dale Brown, Winston Salem, NC (US)

(73) Assignee: TE Connectivity Solutions GmbH (CH)

( * ) Notice: Subject to any disclaimer, the term of this patent is extended or adjusted under 35 U.S.C. 154(b) by 378 days.

(21) Appl. No.: 17/941,663

(22) Filed: Sep. 9, 2022

(65) Prior Publication Data

US 2023/0079080 A1  Mar. 16, 2023

Related U.S. Application Data

(60) Provisional application No. 63/244,138, filed on Sep. 14, 2021.

(51) Int. Cl.
*H02G 3/08* (2006.01)
*H05K 7/14* (2006.01)

(52) U.S. Cl.
CPC .......... *H02G 3/081* (2013.01); *H05K 7/1427* (2013.01)

(58) Field of Classification Search
CPC ......... H02G 3/08; H02G 3/081; H05K 7/1427
USPC ........................................... 174/50
See application file for complete search history.

(56) References Cited

U.S. PATENT DOCUMENTS

2008/0220629 A1\* 9/2008 Hamner ............... H05K 7/1084
439/73

\* cited by examiner

*Primary Examiner* — Tremesha W Burns

(57) ABSTRACT

A reconfigurable electrical box includes an enclosure, and an electrical component arranged within the enclosure. A plurality of base contacts are arranged within the enclosure and are electrically connected to the electrical component, and a plurality of external contacts are arranged over and selectively conductively connected to a portion of the plurality of base contacts. A frame is fitted over the plurality of external contacts and is attached to the enclosure. The frame fixes the position of the external contacts relative to the plurality of base contacts.

20 Claims, 1 Drawing Sheet

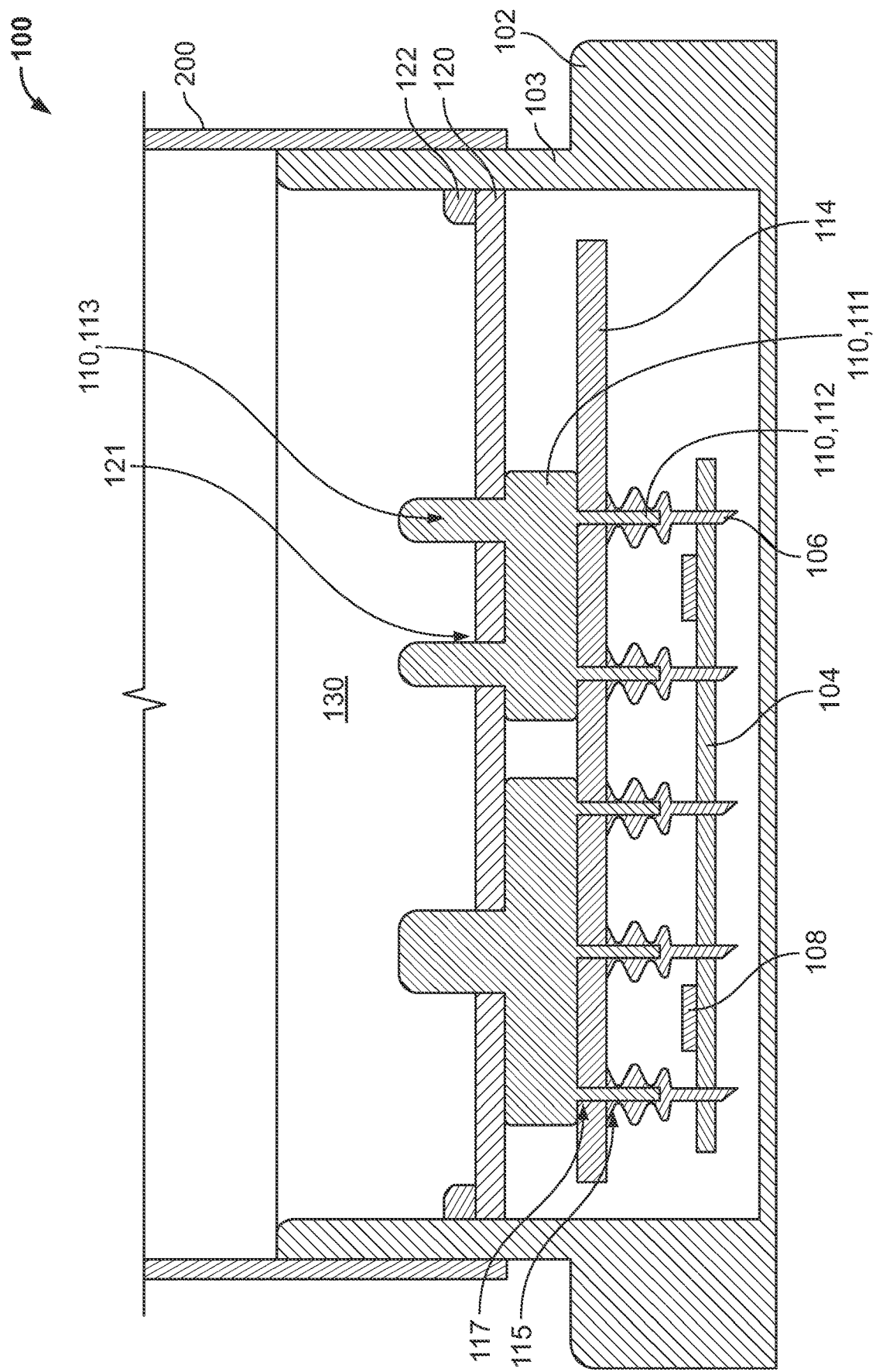

CONFIGURABLE BOX BRIDGE FRAME

CROSS-REFERENCE TO RELATED APPLICATION

This application claims priority under 35 U.S.C. § 119 to U.S. Provisional Patent Application No. 63/244,138, filed on Sep. 14, 2021.

FIELD OF THE INVENTION

The present invention relates to electronics, and more particularly, to a reconfigurable electrical box.

BACKGROUND

Modern electrical systems, such as those used in automotive applications, are complex arrangements requiring numerous electrical components. One common component is an electrical box, or an electrical enclosure. These electrical boxes may house components such as printed circuit boards (PCBs) having mounted power handle features, control components, switches, sensors, and the like. Currently, these electrical boxes are generally application-specific, and thus tailored for an individual automobile or platform, by way of example only.

Given the limited availability of critical components often used in these devices (e.g., semiconductors), however, it is difficult to maintain inventories of these electrical boxes for all required applications. Accordingly, there is a need for an electrical box which is reconfigurable for multiple distinct applications.

SUMMARY

In one embodiment of the present disclosure, a reconfigurable electrical box includes an enclosure, and an electrical component arranged within the enclosure. A plurality of base contacts are arranged within the enclosure and are electrically connected to the electrical component, and a plurality of external contacts are arranged over and selectively conductively connected to a portion of the plurality of base contacts. A frame is fitted over the plurality of external contacts and is attached to the enclosure. The frame fixes the position of the external contacts relative to the plurality of base contacts.

A reconfigurable electrical assembly according to another embodiment of the present disclosure comprises an electrical box including a perimeter wall defining a receptacle opening, and an intermediate wall fixed relative to the perimeter wall and arranged within the receptacle opening and defining a plurality of contact openings. An electrical component is arranged within the electrical box and beneath the intermediate wall. A plurality of receptacle contacts are each aligned with a respective one of the contact openings and are in conductive contact with the electrical component. A first frame is arranged over the intermediate wall within the receptacle opening and is removably attached to the electrical box. An external contact is arranged over the intermediate wall and has a first end extending into at least one of one of the contact openings and engaging with at least one of the receptacle contacts, and a second end extending through the first frame.

BRIEF DESCRIPTION OF THE DRAWINGS

The invention will now be described by way of example with reference to the accompanying FIGURE, of which:

FIG. 1 is a cross-sectional view of an electrical box assembly according to the present disclosure.

DETAILED DESCRIPTION OF THE EMBODIMENTS

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An electrical box assembly 100 according to an embodiment to the present disclosure includes an electrical box or enclosure 102. In one embodiment, the enclosure 102 is comprised of a polymer or other electrically insulating material. The enclosure 102 includes a circumferential end wall or walls 103 defining a receptacle opening or contact space 130. The receptacle opening 130 is adapted to receive one of more mating connectors, such as an exemplary mating connector 200 fitted over the end walls 103 of the enclosure 102. The enclosure 102 further includes an intermediate wall 114 extending generally between the end walls 103, and fixed with respect thereto. In one embodiment, the enclosure 102, including the end walls 103 and intermediate wall 114 are formed integrally with one another.

The enclosure 102 houses electrical components, such as a printed circuit board (PCB) 104, a plurality of board or base contacts, embodied herein as PCB receptacle contacts 106 (as distinct from the board or component mounted blade contacts found in the prior art). The enclosure 102 further contains a plurality external contacts or blade contacts 110, such as bridged header blades, electrically connected to a portion of the plurality of receptacle contacts 106.

The plurality of receptacle contacts 106 are inserted into or installed on the PCB 104. The receptacle contacts 106 are electrically connected to various components or conductive traces arranged or formed on the PCB 104. In one embodiment, the receptacle contacts 106 are connected to one or more programmable components 108, such as a microprocessor, field programmable gate array, or the like.

The intermediate wall 114 is arranged generally over the PCB 104 and receptacle contacts 106 in a vertical direction with respect to the orientation shown. The intermediate wall 114 defines a grid of openings 115, only a portion of which are shown. The openings 115 correspond in location to the plurality of receptacle contacts 106. The openings 115 and receptacle contacts 106 are sized to receive conductive ends of the plurality of external contacts 110. Specifically, as shown, each contact 110 has a base 111, at least one first contact end 112 (e.g., a pin-shaped end) and a second or external contact end 113 (e.g., at least one blade-shaped end). In the exemplary embodiment, each of the openings 115 defines a tapered or chamfered receiving end 117, easing placement of the first contact ends 112 during installation of the contacts 110. During initial assembly, one of more external contacts 110 are installed into a desired position within the grid of openings 115, corresponding to desired receptacle pins (and associated PCB features) for a given application. Different applications may require different external contacts 110 and/or distinct mounting locations relative to the PCB 104/receptacle contacts 106.

With the external contacts 110 installed into desired positions through the intermediate wall 114 and engaged with desired receptacle contacts 106, a frame or top plate 120 is installed over the contacts. The frame 120 is used to clamp the contact(s) 110 between the intermediate wall 114 and the frame 120, securing their position as well as supporting them during plugging and unplugging operations, for example. In some embodiments, the frame 120 comprises openings 121 matching a specific configuration of the external contact ends 113 of each contact 110 for a given application (i.e., an application specific frame). In other embodiments, the openings 121 may be formed in a manner to accommodate numerous distinct arrangements of the external contacts 110 (i.e., a universal frame).

In one embodiment, the frame 120 is secured to the enclosure 102 in a removable manner, facilitating reconfiguration and/or repair of the assembly 100. In the exemplary illustrated embodiment, the frame 120 is secured to the end walls 103 on at least two sides of the enclosure 102. Specifically, the frame 120 is snap-fit under two protrusions or latches 122 formed integrally with the end walls 103. In some embodiments, removal of the frame 120 from the enclosure 102 is destructive in nature, wherein reconfiguring the electrical box assembly 100 would require the use of a new frame matching any new contact configuration. In other embodiments, the frame 120 may be removed without damage, such as by using a prying tool. Of course, other means of fastening the frame 120 to the enclosure 102 are considered, such as the formation of one or more recesses into the end walls 103 into which the frame is fit, or via the use of one or more fasteners (e.g., screws or bolts).

Modern programmable electronics permit the use of a single electrical box according to embodiments of the present disclosure for various uses in countless applications. Embodiments of the present disclosure enable the removal of the frame, removal/replacement of the bridge contacts in any desired configuration or any suitable application, and the reprogramming of the components within the enclosure or other components of any associated systems. Thus, embodiments of the present disclosure are easily reconfigurable, leading to less needed inventory, less limited component usage, and countless additional advantages. The configuration of the box is moved to the harness connection and the intermediate bridged connection(s). For example, a portion of a female harness connector 200 mated to the enclosure 102 is shown in FIG. 1. When coupled with software programming, embodiments of the electrical box assembly 100 can be configured for various applications.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A reconfigurable electrical box, comprising: an enclosure including an intermediate wall arranged therein; an electrical component arranged within the enclosure and beneath the intermediate wall; a plurality of base contacts arranged within the enclosure and electrically connected to the electrical component; a plurality of external contacts arranged over and selectively conductively connected to a portion of the plurality of base contacts, portions of the plurality of external contacts extending through a frame and adapted to engage with an external connector, each of the plurality of external contacts including a base arranged above the intermediate wall and a first contact end extending through the intermediate wall and into electrical engagement with the base contacts; and the frame fitted over the plurality of external contacts and attached to the enclosure, the frame fixing the position of the external contacts relative to the plurality of base contacts, wherein the external contacts are clamped between the intermediate wall and the frame.

2. The electrical box of claim 1, wherein the base contacts comprise receptacle contacts adapted to receive free ends of the first contact ends.

3. The electrical box of claim 1, wherein the external contacts comprise bridged blade contacts.

4. The electrical box of claim 1, wherein the frame is removably attached to the enclosure.

5. The electrical box of claim 4, wherein the enclosure defines at least one latch engaging with the frame for fixing the frame to the enclosure.

6. The electrical box of claim 1, wherein the enclosure defines a receptacle opening, and the frame fixed within the opening.

7. The electrical box of claim 1, wherein the external contacts are connectable with the base contacts in a plurality of distinct orientations.

8. The electrical box of claim 1, wherein the electrical component comprises a printed circuit board (PCB).

9. A reconfigurable electrical assembly, comprising:
an electrical box including a perimeter wall defining a receptacle opening;
an intermediate wall fixed relative to the perimeter wall and arranged within the receptacle opening and defining a plurality of contact openings;
an electrical component arranged within the electrical box and beneath the intermediate wall;
a plurality of receptacle contacts each aligned with a respective one of the contact openings and in conductive contact with the electrical component;
a first frame arranged over the intermediate wall within the receptacle opening and removably attached to the electrical box; and
an external contact arranged over the intermediate wall and having a first end extending into at least one of the contact openings and engaging with at least one of the receptacle contacts, and a second end extending through the first frame.

10. The reconfigurable electrical assembly of claim 9, wherein the external contact is insertable into the plurality of contact openings in a plurality of distinct positions;
   a plurality of external contacts arranged over the intermediate wall and directly conductively connected to the plurality of base contacts via a plurality of openings formed through the intermediate wall; and
   a frame fitted over the plurality of external contacts and attached to the enclosure, the frame fixing the position of the external contacts relative to the plurality of base contacts.

11. The reconfigurable electrical assembly of claim 10, wherein the first frame comprises an opening corresponding in location to the second end of the external contact.

12. The reconfigurable electrical assembly of claim 11, further comprising a second frame arrangeable within the receptacle opening with the first frame removed therefrom, the second frame defining an opening corresponding in location to the second end of the external contact with the external contact arranged in a position distinct from a position associated with the first frame.

13. The reconfigurable electrical assembly of claim 9, wherein the first frame is removably attached to the perimeter wall.

14. The reconfigurable electrical assembly of claim 9, wherein the external contact is secured between the intermediate wall and the first frame.

15. The reconfigurable electrical assembly of claim 9, wherein the electrical component is a printed circuit board.

16. The reconfigurable electrical assembly of claim 9, wherein the external contact comprises a plurality of bridge contacts.

17. A reconfigurable electrical box, comprising:
   an enclosure defining a receptacle adapted to engage with a mating connector in a mating direction;
   an electrical component arranged within the enclosure;
   a plurality of base contacts arranged within the enclosure and directly electrically connected to the electrical component;
   an intermediate wall arranged over the plurality of base contacts, the base contacts arranged between the intermediate wall and the electrical component in the mating direction;
   a plurality of external contacts arranged over the intermediate wall and directly conductively connected to the plurality of base contacts via a plurality of openings formed through the intermediate wall; and
   a frame fitted over the plurality of external contacts and attached to the enclosure, the frame fixing the position of the external contacts relative to the plurality of base contacts.

18. The electrical box of claim 17, wherein at least a portion of the plurality of external contacts are arranged between the frame and the intermediate wall in the mating direction.

19. The electrical box of claim 18, wherein at least portions of each of the plurality of external contacts oppose the intermediate wall and the frame in the mating direction and a direction opposite the mating direction such that the external contacts are clamped between the intermediate wall and the frame.

20. The electrical box of claim 17, wherein:
   first ends of the plurality of external contacts extend through the intermediate wall in the mating direction and into electrical contact with corresponding ones of the plurality of base contacts; and
   second ends of the plurality of external contacts extend through the frame in a direction opposite the mating direction for electrically connecting with the mating connector.

* * * * *